United States Patent
Xu

(10) Patent No.: US 11,114,561 B2
(45) Date of Patent: Sep. 7, 2021

(54) LDMOS DEVICE AND METHOD FOR MANUFACTURING SAME

(71) Applicant: Shanghai Huahong Grace Semiconductor Manufacturing Corporation, Shanghai (CN)

(72) Inventor: Zhaozhao Xu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/569,135

(22) Filed: Sep. 12, 2019

(65) Prior Publication Data

US 2020/0105927 A1   Apr. 2, 2020

(30) Foreign Application Priority Data

Sep. 29, 2018 (CN) .......................... 201811144001.8

(51) Int. Cl.
*H01L 29/78* (2006.01)
*H01L 21/265* (2006.01)
*H01L 21/28* (2006.01)
*H01L 21/3213* (2006.01)
*H01L 29/08* (2006.01)
(Continued)

(52) U.S. Cl.
CPC .... *H01L 29/7823* (2013.01); *H01L 21/26513* (2013.01); *H01L 21/28052* (2013.01); *H01L 21/32133* (2013.01); *H01L 29/0865* (2013.01); *H01L 29/0882* (2013.01); *H01L 29/1033* (2013.01); *H01L 29/1095* (2013.01); *H01L 29/401* (2013.01); *H01L 29/402* (2013.01); *H01L 29/45* (2013.01);
(Continued)

(58) Field of Classification Search
CPC ......... H01L 21/26513; H01L 21/28052; H01L 29/0865; H01L 29/4933; H01L 29/66659; H01L 29/7835; H01L 29/401; H01L 29/665; H01L 29/7823; H01L 29/1033; H01L 29/0882; H01L 29/1095; H01L 29/66681; H01L 29/45; H01L 29/402
See application file for complete search history.

(56) References Cited

U.S. PATENT DOCUMENTS

2013/0187226 A1* 7/2013 Park .................. H01L 29/66659 257/343
2015/0214356 A1* 7/2015 Yoshida .............. H01L 29/0634 257/330

(Continued)

*Primary Examiner* — Vongsavanh Sengdara
(74) *Attorney, Agent, or Firm* — Murtha Cullina LLP

(57) ABSTRACT

LDMOS device including a drift region, a body region, a gate dielectric layer, a polysilicon gate, a source region, a drain region and a common dielectric layer, the common dielectric layer covers a portion, between a second side of the polysilicon gate and the drain region, of the surface of the drift region, extends onto the surface of the polysilicon gate and also covers part of the surface of the drain region, a self-aligned metal silicide is formed on portions, not covered by the common dielectric layer, of the surfaces of the polysilicon gate, the source region and the drain region, and the common dielectric layer serves as a growth barrier layer of the self-aligned metal silicide; a drain terminal field plate is formed on a portion of the surface of the common dielectric layer; and a portion of the common dielectric layer serves as a field plate dielectric layer.

8 Claims, 6 Drawing Sheets

(51) Int. Cl.
  *H01L 29/10*  (2006.01)
  *H01L 29/40*  (2006.01)
  *H01L 29/45*  (2006.01)
  *H01L 29/49*  (2006.01)
  *H01L 29/66*  (2006.01)

(52) U.S. Cl.
  CPC ........ *H01L 29/4933* (2013.01); *H01L 29/665* (2013.01); *H01L 29/66681* (2013.01)

(56) References Cited

U.S. PATENT DOCUMENTS

2015/0294898 A1* 10/2015 Yamaguchi ....... H01L 21/02274
  257/506
2017/0373137 A1* 12/2017 Birner ................ H01L 29/4175

* cited by examiner

LDMOS DEVICE AND METHOD FOR MANUFACTURING SAME

CROSS-REFERENCE TO RELATED APPLICATION

This application claims the priority of Chinese patent application number 201811144001.8, filed on Sep. 29, 2018, the entire contents of which are incorporated herein by reference.

BACKGROUND OF THE INVENTION

Technical Field

The invention relates to the field of manufacturing of semiconductor integrated circuits, in particular to a laterally diffused metal oxide semiconductor LDMOS device and a method for manufacturing a LDMOS device.

Description of Related Art

With the characteristics of high voltage resistance, high current driving capacity, extremely low power consumption and the like, double-diffused metal oxide semiconductor MOSs have nowadays been widely applied to power management circuits. DMOSs include vertical diffused metal oxide semiconductor VDMOSs and LDMOSs. The spreading resistance is one important index of LDMOS devices. Although LDMOSs and complementary metal oxide semiconductors CMOSs are integrated in the same chip through the (BiPolar CMOSs) BCD process, in order to meet the requirements for high voltage resistance and low characteristic resistance, namely the spreading resistance (Rsp), silicon on the surfaces of the devices should be protected against damage to the maximum extent in the integration process, which may otherwise cause performance degradation of the devices.

FIG. 1 is a structural view of an existing LDMOS device. For instance, if the existing LDMOS device is an N-type device, the existing LDMOS device comprises:

An N-type first epitaxial layer 102, wherein a P-type drift region 104 and an N-type body region 105 are formed in selected areas of the first epitaxial layer 102, and the drift region 104 is horizontally spaced from the body region 105 by a certain distance.

A P-type heavily-doped first buried layer 101 is formed at the bottom of the first epitaxial layer 102 and is located on the surface of a semiconductor substrate. Usually, the semiconductor substrate is a P-type doped silicon substrate, and the first epitaxial layer 102 is a silicon epitaxial layer.

A drift region field oxide 103 is formed in a selected area of the drift region 104.

A gate structure formed by stacking a gate dielectric layer (such as a gate oxide 106) and a polysilicon gate 107 is formed on the surface of the body region 105, and channels are formed on the surface, covered by the polysilicon gate 107, of the body region 105.

A second side of the gate dielectric layer 106 makes contact with a first side of the drift region field oxide 103, and a second side of the polysilicon gate 107 extends onto the surface of the drift region field oxide 103.

A source region 108a is formed on the surface of the body region 105 and has a second side self-aligned with a first side of the polysilicon gate 107.

A drain region 108b is formed in the drift region 104 and has a first side self-aligned with a second side of the drift region field oxide 103.

An N-type heavily-doped body lead-out region 109 is formed on the surface of the body region 105 and makes contact with the side face of a first side of the source region 108a. The body lead-out region 109 and the source region 108a are connected to a source electrode formed by a front metal layer via the same contact hole.

The drain region 108b is connected to a drain electrode formed by the front metal layer via a contact hole. The polysilicon gate 107 is connected to a gate electrode formed by the front metal layer via a contact hole.

In FIG. 1, the drift region field oxide 103 is formed on the surface of the first epitaxial layer 102 through deposition and photo-etching of an oxide layer. When manufactured in this way, the drift region field oxide 103 has to be accurately controlled in the etching process to prevent the surface (namely silicon surface) of the first epitaxial layer 102 from being damaged when the oxide layer is etched, which may otherwise cause performance degradation, such as Rsp increase and breakdown voltage (BV) decrease, of the device.

BRIEF SUMMARY OF THE INVENTION

A technical issue to be addressed by the invention is to lower the process difficulty and to improve the competitiveness by providing a LDMOS device and a method for manufacturing a LDMOS device.

To address the above technical issue, the invention provides a LDMOS device.

The LDMOS device comprises: a first epitaxial layer of a second conduction type, wherein a drift region of a first conduction type and a body region of the second conduction type are formed in selected areas of the first epitaxial layer, and the drift region horizontally makes contact with the body region or is spaced from the body region by a certain distance; a gate structure which is formed on the surface of the body region by stacking a gate dielectric layer and a polysilicon gate, wherein channels are formed on the surface, covered by the polysilicon gate, of the body region, and a second side of the gate dielectric layer and a second side of the polysilicon gate extend onto the surface of the drift region; a source region which is formed on the surface of the body region and has a second side self-aligned with a first side of the polysilicon gate; a drain region which is formed in a selected area of the drift region and has a first side spaced from the second side of the polysilicon gate by a certain distance; and a common dielectric layer, wherein common dielectric layer covers a portion, between the second side of the polysilicon gate and the drain region, of the surface of the drift region, extends onto the surface of the polysilicon gate and also covers part of the surface of the drain region, a self-aligned metal silicide is formed on portions, not covered by the common dielectric layer, of the surfaces of the polysilicon gate, the source region and the drain region, and the common dielectric layer serves as a growth barrier layer of the self-aligned metal silicide.

A drain terminal field plate is formed on a portion, between the second side of the polysilicon gate and the drain region, of the surface of the common dielectric layer, and a self-aligned metal silicide is formed on the surface of the drain terminal field plate. A portion, located at the bottom of the drain terminal field plate, of the common dielectric layer serves as a field plate dielectric layer.

Furthermore, a first heavily-doped buried layer of the first conduction type is formed at the bottom of the first epitaxial layer and is located on the surface of a semiconductor substrate.

Furthermore, the semiconductor substrate is a silicon substrate, and the first epitaxial layer is a silicon epitaxial layer.

The gate dielectric layer is made from silicon oxide.

The common dielectric layer is made from silicon oxide.

Furthermore, a heavily-doped body lead-out region of the second conduction type is formed on the surface of the body region and makes contact with the side face of a first side of the source region, and the self-aligned metal silicide on the surface of the source region extends onto the surface of the body lead-out region.

Furthermore, the LDMOS device further comprises: a contact hole etching stop layer, an interlayer film, contact holes and a front metal layer.

The contact holes penetrate through the corresponding interlayer film and the contact hole etching stop layer and make contact with the self-aligned metal silicide at the bottoms of the contact holes.

The corresponding contact holes are formed at the tops of the source region, the drain region, the polysilicon gate and the drain terminal field plate. The source region is connected to a source electrode formed by the front metal layer via the contact hole at the top of the source region. The drain region is connected to a drain electrode formed by the front metal layer via the contact hole at the top of the drain region. The polysilicon gate is connected to a gate electrode formed by the front metal layer via the contact hole at the top of the polysilicon gate. The drain terminal field plate is also connected to the gate electrode formed by the front metal layer via the contact hole at the top of the drain terminal field plate.

Furthermore, the contact hole etching stop layer is formed by stacking an oxide layer and a nitride layer.

The interlayer film is formed by an oxide layer.

Furthermore, a spacer is formed on the side face of the polysilicon gate.

Furthermore, the drain terminal field plate comprises a second polysilicon layer or a self-aligned metal silicide formed through self-aligned metal silicification on the surface of the second polysilicon layer. If the thickness of the second polysilicon layer is decreased to be smaller than 200 Å, the second polysilicon layer is completely converted into the self-aligned metal silicide, and in this case, the drain terminal field plate is completely formed by the self-aligned metal silicide.

If the second polysilicon layer is not completely converted into the self-aligned metal silicide, the drain terminal field plate is formed by stacking the rest of the second polysilicon layer and the self-aligned metal silicide on the surface of the second polysilicon layer.

Furthermore, the LDMOS device is an N-type device, the first conduction type is an N type, and the second conduction type is a P type; or, the LDMOS device is a P-type device, the first conduction type is a P type, and the second conduction type is an N type.

To settle the above technical issue, the invention further provides a method for manufacturing a LDMOS device. The method comprises the following steps:

Step 1, providing a first epitaxial layer of a second conduction type, wherein a drift region of a first conduction type and a body region of the second conduction type are formed in selected areas of the first epitaxial layer, and the drift region horizontally makes contact with the body region or is spaced from the body region by a certain distance; Step 2, sequentially forming a gate dielectric layer and a polysilicon gate and carrying out photo-etching to form a gate structure on the surface of the body region by stacking the gate dielectric layer and the polysilicon gate, wherein channels are formed on the surface, covered by the polysilicon gate, of the body region, and a second side of the gate dielectric layer and a second side of the polysilicon gate extend onto the surface of the drift region; and Step 3, carrying out source-drain implantation of the first conduction type to form a source region and a drain region wherein, the source region is formed on the surface of the body region and has a second side self-aligned with a first side of the polysilicon gate.

The drain region is formed in a selected area of the drift region and has a first side spaced from the second side of the polysilicon gate by a certain distance, and the corresponding selected area of the drain region is defined through photo-etching; Step 4, sequentially forming a common dielectric layer and a second polysilicon layer; Step 5, etching the second polysilicon layer according to a lithography definition wherein after being etched, the second polysilicon layer is located on a portion, between the second side of the polysilicon gate and the drain region, of the surface of the common dielectric layer; Step 6, photo-etching the common dielectric layer, wherein after being etched, the common dielectric layer covers a portion, between the second side of the polysilicon gate and the drain region, of the surface of the drift region, extends onto the surface of the polysilicon gate and covers part of the surface of the drain region, and portions, not covered by the common dielectric layer, of the surfaces of the polysilicon gate, the source region and the drain region are exposed; Step 7, forming a self-aligned metal silicide on the exposed portions of the surfaces of the polysilicon gate, the source region, the drain region and the second polysilicon layer with the common dielectric layer as a growth barrier layer of the self-aligned metal silicide, wherein a drain terminal field plate comprises the second polysilicon layer or the self-aligned metal silicide formed through self-aligned metal silicification on the surface of the second polysilicon layer, and a portion, located at the bottom of the drain terminal field plate, of the common dielectric layer serves as a field plate dielectric layer.

Furthermore, in Step 1, a first heavily-doped buried layer of the first conduction type is formed at the bottom of the first epitaxial layer and is located on the surface of a semiconductor substrate.

Furthermore, the semiconductor substrate is a silicon substrate, and first epitaxial layer is a silicon epitaxial layer.

The gate dielectric layer is made from silicon oxide.

The common dielectric layer is made from silicon oxide.

Furthermore, in Step 3, heavily-doped implantation of the second conduction type is carried out to form a body lead-out region on the surface of the body region, wherein the body lead-out region makes contact with the side face of a first side of the source region; the self-aligned metal silicide formed on the surface of the source region in Step 7 extends onto the surface of the body lead-out region.

Furthermore, the method further comprises the following steps: Step 8, forming a contact hole etching stop layer; Step 9, forming an interlayer film; Step 10, forming contact holes, wherein the corresponding contact holes are formed at the tops of the source region, the drain region, the polysilicon gate and the drain terminal field plate, and the contact holes penetrate through the corresponding interlayer film and the contact hole etching stop layer and make contact with the self-aligned metal silicide at the bottoms of the contact holes; and Step 11, forming a front metal layer and patterning the front metal layer through photo-etching to form a source electrode, a gate electrode and a drain electrode.

Wherein, the source region is connected to the source electrode via the contact hole at the top of the source region, the drain region is connected to the drain electrode via the contact hole at the top of the drain region, the polysilicon gate is connected to the gate electrode via the contact hole at the top of the polysilicon gate, and the drain terminal field plate is also connected to the gate electrode via the contact hole at the top of the drain terminal field plate.

Furthermore, the contact hole etching stop layer is formed by stacking an oxide layer and a nitride layer.

The interlayer film is formed by an oxide layer.

Furthermore, in Step 2, a spacer is formed on the side face of the polysilicon gate after the gate structure is formed.

Furthermore, if the thickness of the second polysilicon layer is decreased to be smaller than 200 Å, the second polysilicon layer is completely converted into the self-aligned metal silicide, and in this case, the drain terminal field plate is completely formed by the self-aligned metal silicide. If the second polysilicon layer is not completely converted into the self-aligned metal silicide, the drain terminal field plate is formed by stacking the rest of the second polysilicon layer and the self-aligned metal silicide on the surface of the second polysilicon layer.

The LDMOS device is not provided with an independent drift region field oxide; as the substitute, the common dielectric layer serving as the growth barrier layer of the self-aligned metal silicide is adopted to fulfill the function of the drift region field oxide, the drain terminal field plate is independently formed at the top of common dielectric layer at the top of the drift region located between the polysilicon gate and the drain region, and the electric field distribution on the surface of the drift region at the bottom is adjusted through the coverage of the drain terminal field plate, so that the breakdown voltage of the device is increased. From the above description, the common dielectric layer and the drain terminal field plate are stacked together to replace an existing field plate formed by an independent drift region field oxide and a polysilicon gate extending to the top of the drift region field oxide. Although both structures can achieve adjustment of the electric field distribution on the surface of the drift region, the common dielectric layer of the invention does not need to be independently manufactured and also serves as the growth barrier layer of the self-aligned metal silicide, and thus, the process difficulty is lowered, the process competitiveness of products is improved. In addition, although photo-etching needs to be carried out once to define the drain terminal field plate in the invention, photo-etching used for independently forming the drift region field oxide is not needed, and thus, the number of masks used for photo-etching is not increased, and the cost is not increased either.

BRIEF DESCRIPTION OF THE SEVERAL VIEWS OF THE DRAWINGS

The invention is further expounded below with reference to the accompanying drawings and specific embodiments.

DETAILED DESCRIPTION OF THE INVENTION

Figure 1:
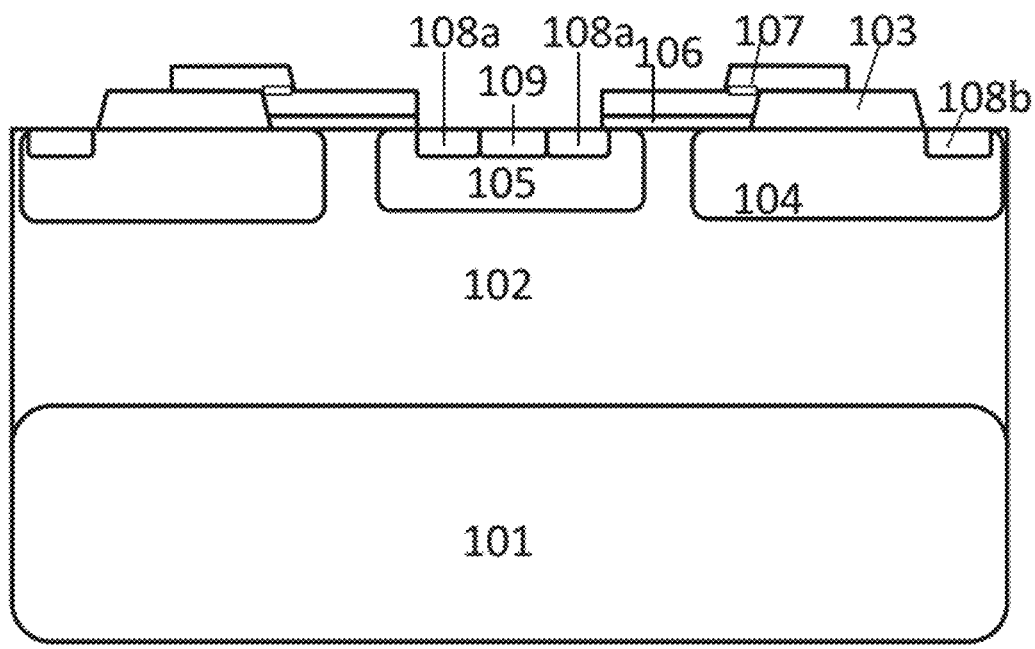
FIG. 1 is a structural view of an existing LDMOS device.
Figure 2:
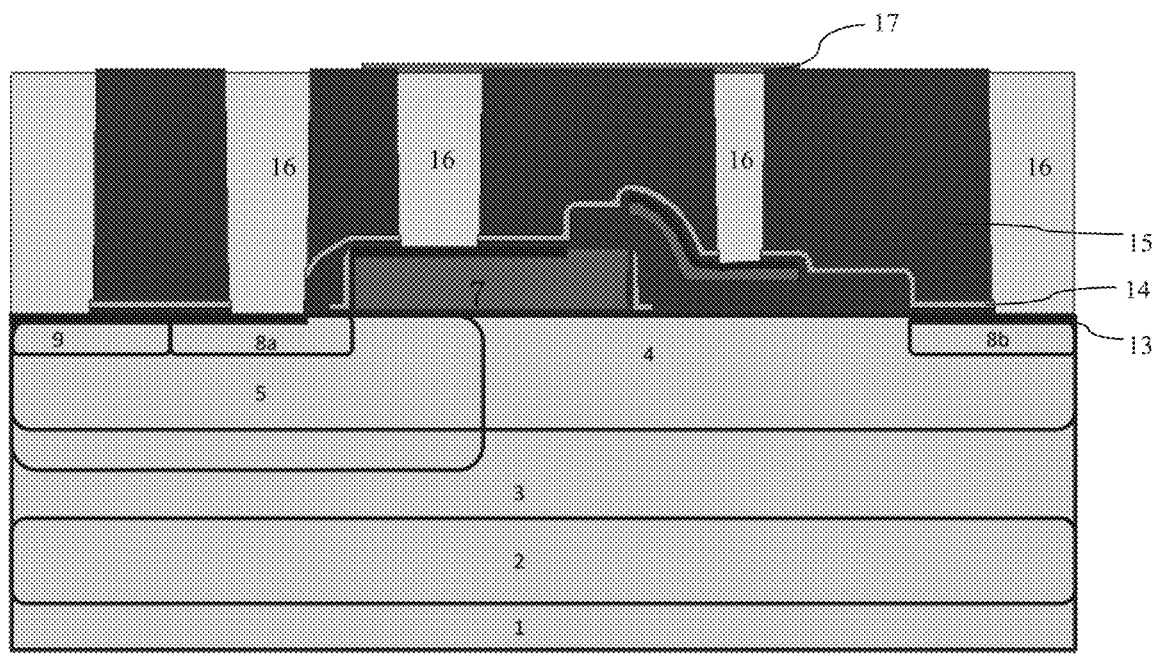
FIG. 2 is a structural view of a LDMOS device in one embodiment of the invention.

FIG. 2 is a structural view of a LDMOS device in one embodiment of the invention. The LDMOS device in this embodiment includes: a first epitaxial layer 3 of a second conduction type, wherein a drift region 4 of a first conduction type and a body region 5 of the second conduction type are formed in selected areas of the first epitaxial layer 3, and the drift region 4 horizontally makes contact with the body region 5; and in other embodiments, the drift region 4 may be spaced from the body region 5 by a certain distance; a gate structure which is formed on the surface of the body region 5 by stacking a gate dielectric layer 6 and a polysilicon gate 7, wherein channels are formed on the surface, covered by the polysilicon gate 7, of the body region 5, and a second side of the gate dielectric layer 6 and a second side of the polysilicon gate 7 extend onto the surface of the drift region 4; a source region 8a which is formed on the surface of the body region 5 and has a second side self-aligned with a first side of the polysilicon gate 7; a drain region 8b which is formed in a selected area of the drift region 4 and has a first side spaced from the second side of the polysilicon gate 7 by a certain distance; and a common dielectric layer 11, wherein the common dielectric layer 11 covers a portion, between the second side of the polysilicon gate 7 and the drain region 8b, of the surface of the drift region 4, extends onto the surface of the polysilicon gate 7 and also covers part of the surface of the drain region 8b; a self-aligned metal silicide 13 is formed on portions, not covered by the common dielectric layer 11, of the surfaces of the polysilicon gate 7, the source region 8a and the drain region 8b, and the common dielectric layer 11 serves as a growth barrier layer of the self-aligned metal silicide 13.

A drain terminal field plate is formed on a portion, between the second side of the polysilicon gate 7 and the drain region 8b, of the surface of the common dielectric layer 11, and a portion, located at the bottom of the drain terminal field plate, of the common dielectric layer 11 serves as a field plate dielectric layer.

The drain terminal field plate comprises a second polysilicon layer 12 or a self-aligned metal silicide 13 formed through self-aligned metal silicification on the surface of the second polysilicon layer 12. If the thickness of the second polysilicon layer 12 is decreased to be smaller than 200 Å, the second polysilicon layer 12 is completely converted into the self-aligned metal silicide 13, and in this case, the drain terminal field plate is completely formed by the self-aligned metal silicide 13.

If the second polysilicon layer 12 is not completely converted into the self-aligned metal silicide 13, the drain terminal field plate is formed by stacking the rest of the second polysilicon layer 12 and the self-aligned metal silicide 13 on the surface of the second polysilicon layer 12.

In this embodiment, a first heavily-doped buried layer 2 of the first conduction type is formed at the bottom of the first epitaxial layer 3 and is located on the surface of a semiconductor substrate 1. Usually, the semiconductor substrate 1 is a P-type doped semiconductor substrate.

The semiconductor substrate 1 is a silicon substrate, and the first epitaxial layer 3 is a silicon epitaxial layer.

The gate dielectric layer 6 is made from silicon oxide.

The common dielectric layer 11 is made from silicon oxide.

A heavily-doped body lead-out region 9 of the second conduction type is formed on the surface of the body region 5 and makes contact with the side face of a first side of the source region 8a, and the self-aligned metal silicide 13 on the surface of the source region 8a extends onto the surface of the body lead-out region 9.

The LDMOS device further includes: a contact hole etching stop layer 14, an interlayer film 15, contact holes 16 and a front metal layer 17.

The contact holes 16 penetrate through the corresponding interlayer film 15 and the contact hole etching stop layer 14 and make contact with the self-aligned metal silicide 13 at the bottoms of the contact holes 16.

The corresponding contact holes 16 are formed at the tops of the source region 8a, the drain region 8b, the polysilicon gate 7 and the drain terminal field plate. The source region 8a is connected to a source electrode formed by the front metal layer 17 via the contact hole 16 at the top of the source region 8a. The drain region 8b is connected to a drain electrode formed by the front metal layer 17 via the contact hole 16 at the top of the drain region 8b. The polysilicon gate 7 is connected to a gate electrode formed by the front metal layer 17 via the contact hole 16 at the top of the polysilicon gate 7. The drain terminal field plate is also connected to the gate electrode formed by the front metal layer 17 via the contact hole 16 at the top of the drain terminal field plate.

The contact hole etching stop layer 14 is formed by stacking an oxide layer and a nitride layer.

The interlayer film 15 is formed by an oxide layer.

A spacer 10 is formed on the side face of the polysilicon gate 7. Please refer to FIG. 3D for the spacer 10, and the spacer 10 shown in FIG. 3D is made from silicon oxide and silicon nitride.

In this embodiment, the LDMOS device is an N-type device, the first conduction type is an N type, and the second conduction type is a P type. In other embodiments, the LDMOS device may be a P-type device, the first conduction type may be a P type, and the second conduction type may be an N type.

In this embodiment, an independent drift region field oxide in the LDMOS device is avoided; as the substitute, the common dielectric layer 11 serving as the growth barrier layer of the self-aligned metal silicide 13 is adopted to fulfill the function of the drift region field oxide, the drain terminal field plate is independently formed at the top of common dielectric layer 11 at the top of the drift region 4 located between the polysilicon gate 7 and the drain region 8b, and the electric field distribution on the surface of the drift region 4 at the bottom is adjusted through the coverage of the drain terminal field plate, so that the breakdown voltage of the device is increased. From the above description, the common dielectric layer 11 and the drain terminal field plate are stacked together to replace an existing field plate formed by an independent drift region field oxide and a polysilicon gate 7 extending to the top of the drift region field oxide. Although both structures can achieve adjustment of the electric field distribution on the surface of the drift region 4, the common dielectric layer 11 in this embodiment does not need to be independently manufactured and also serves as the growth barrier layer of the self-aligned metal silicide 13, and thus, this embodiment lower the process difficulty and improves the process competitiveness of products. In addition, although photo-etching needs to be carried out once to define the drain terminal field plate in this embodiment, photo-etching used for independently forming the drift region field oxide is not needed, and thus, the number of masks used for photo-etching is not increased, and the cost is not increased either.

Figure 3A:
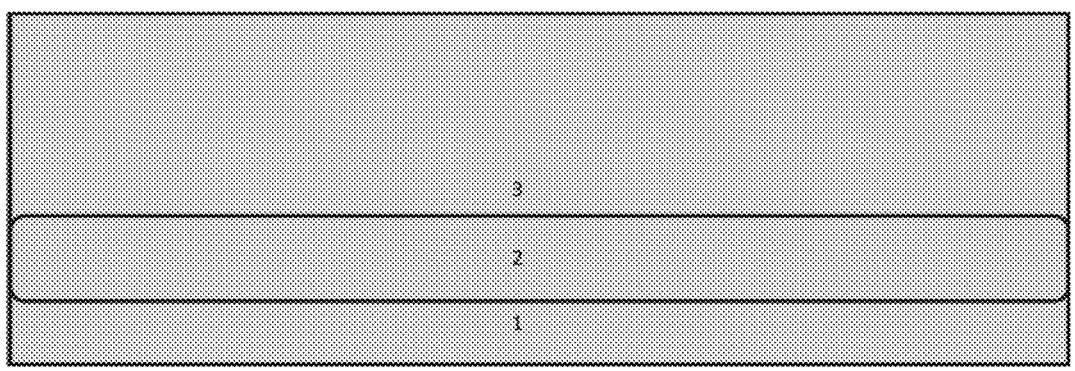
FIGS. 3A-3H are views of device structures in all steps of a method for manufacturing a LDMOS device in one embodiment of the invention.

FIGS. 3A-3H are views of device structures in all steps of a method for manufacturing a LDMOS device in one embodiment of the invention. As shown in FIGS. 3A-3H, the method for manufacturing a LDMOS device includes the following steps:

Step 1, as shown in FIG. 3A, a first epitaxial layer 3 of a second conduction type is provided.

Figure 3B:
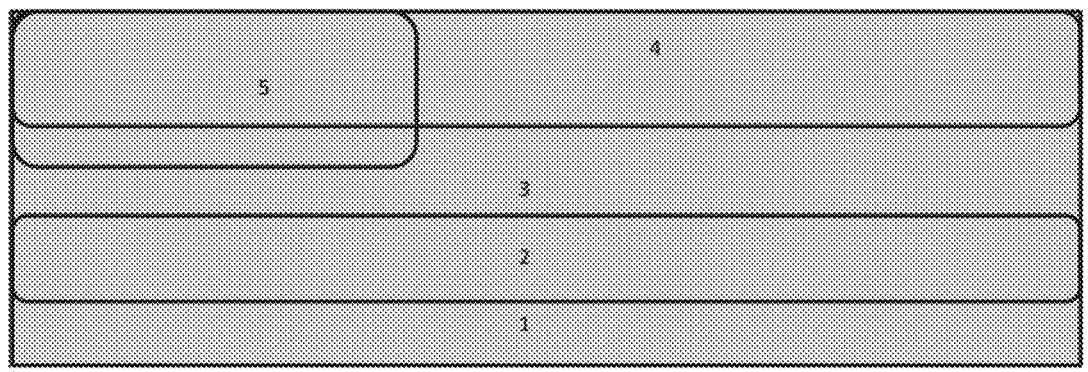

As shown in FIG. 3B, a drift region 4 of a first conduction type and a body region 5 of the second conduction type are formed in selected areas of the first epitaxial layer 3, and the drift region 4 horizontally makes contact with the body region 5. In other embodiments, the drift region 4 may be spaced from the body region 5 by a certain distance.

In this embodiment, a first heavily-doped buried layer 2 of the first conduction type is formed at the bottom of the first epitaxial layer 3 and is located on the surface of a semiconductor substrate 1.

The semiconductor substrate 1 is a silicon substrate, and the first epitaxial layer 3 is a silicon epitaxial layer.

Figure 3C:
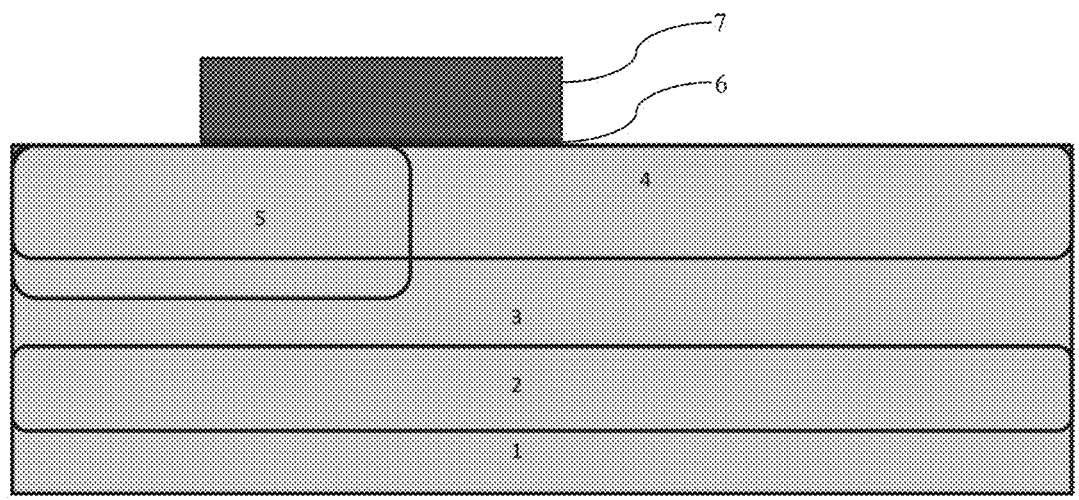
Figure 3D:
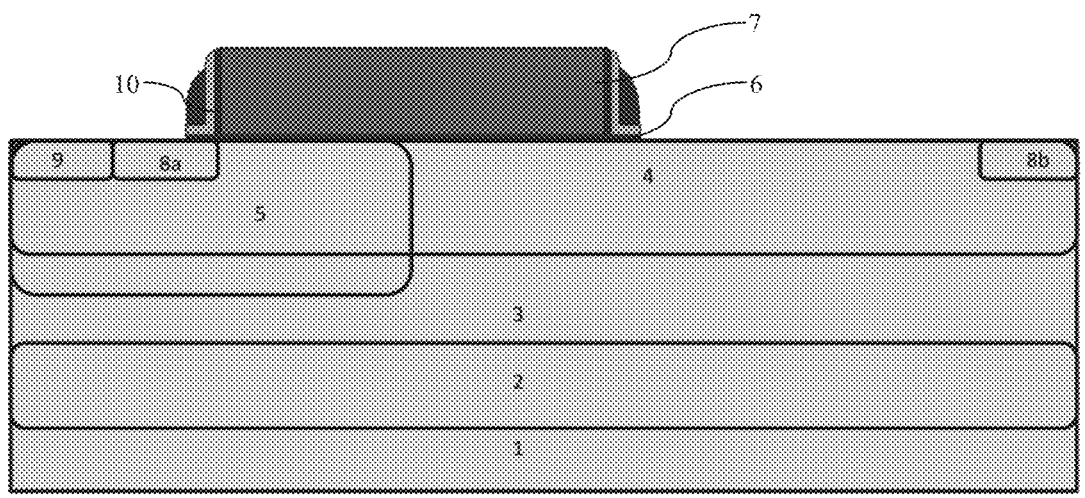

Step 2, as shown in FIG. 3C, a gate dielectric layer 6 and a polysilicon gate 7 are sequentially formed, and photo-etching is carried out to form a gate structure on the surface of the body region 5 by stacking the gate dielectric layer 6 and the polysilicon gate 7, wherein channels are formed on the surface, covered by the polysilicon gate 7, of the body region 5, and a second side of the gate dielectric layer 6 and a second side of the polysilicon gate 7 extend onto the surface of the drift region 4.

The gate dielectric layer 6 is made from silicon oxide.

As shown in FIG. 3D, a spacer 10 is formed on the side face of the polysilicon gate 7. In this embodiment, the spacer 10 is formed by stacking an oxide layer and a nitride layer, and when the spacer 10 is formed, the oxide layer and the nitride layer are sequentially deposited first, and then the nitride layer and the oxide layer are sequentially and comprehensively etched to form the spacer 10.

Step 3, as shown in FIG. 3D, source-drain implantation of the first conduction type is carried out to form a source region 8a and a drain region 8b at the same time.

Wherein, the source region 8a is formed on the surface of the body region 5 and has a second side self-aligned with the first side of a polysilicon gate 7.

The drain region 8b is formed in a selected area of the drift region 4 and has a first side spaced from the second side of the polysilicon gate 7 by a certain distance, and the corresponding selected area of the drain region 8b is defined through photo-etching.

Afterwards, heavily-doped implantation of the second conduction type is carried out to form a body lead-out region 9 on the surface of the body region 5, wherein the body lead-out region 9 makes contact with the side face of a first side of the source region 8a.

Figure 3E:
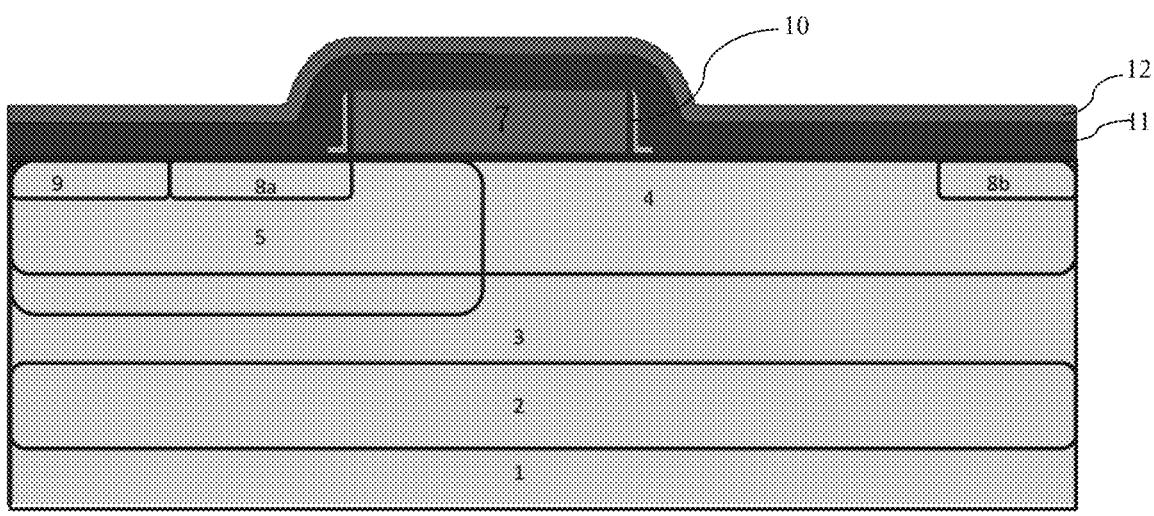

Step 4, as shown in FIG. 3E, a common dielectric layer 11 and a second polysilicon layer 12 are sequentially formed.

Wherein, the common dielectric layer 11 is made from silicon oxide.

Figure 3F:
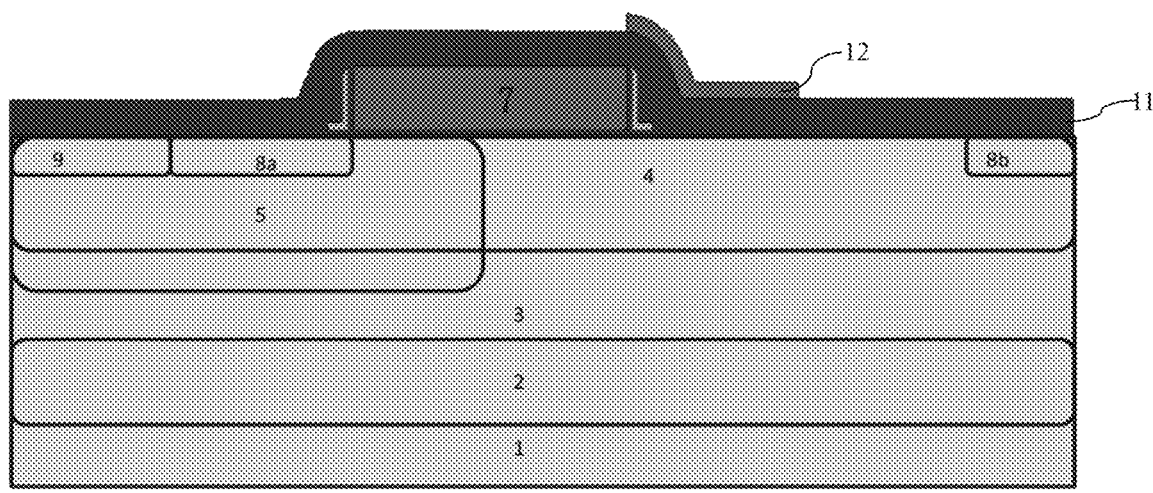

Step 5, as shown in FIG. 3F, the second polysilicon layer 12 is etched according to a lithography definition, wherein after being etched, the second polysilicon layer 12 is located on a portion, between the second side of the polysilicon gate 7 and the drain region 8b, of the surface of the common dielectric layer 11.

Figure 3G:
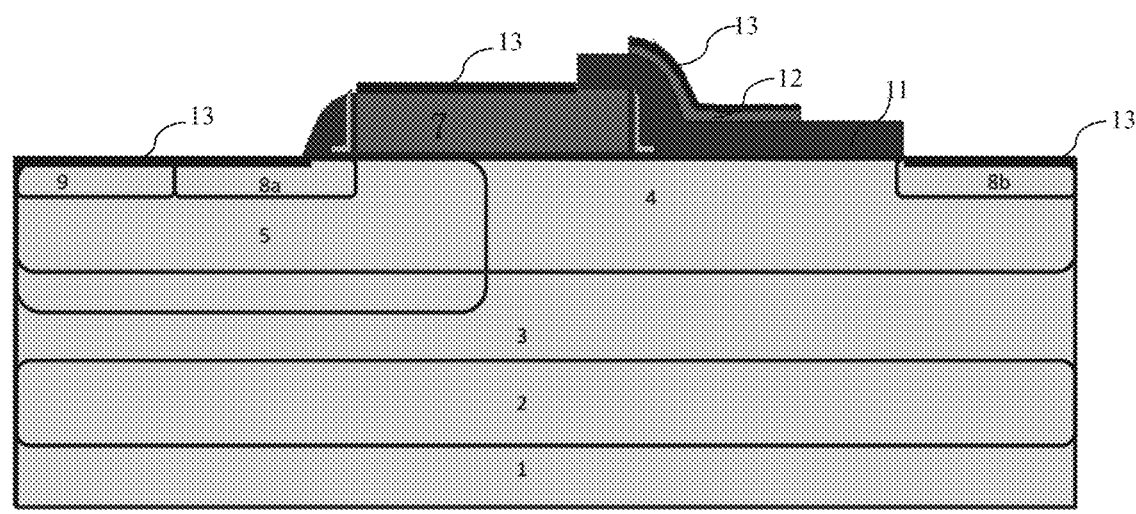
Figure 3H:
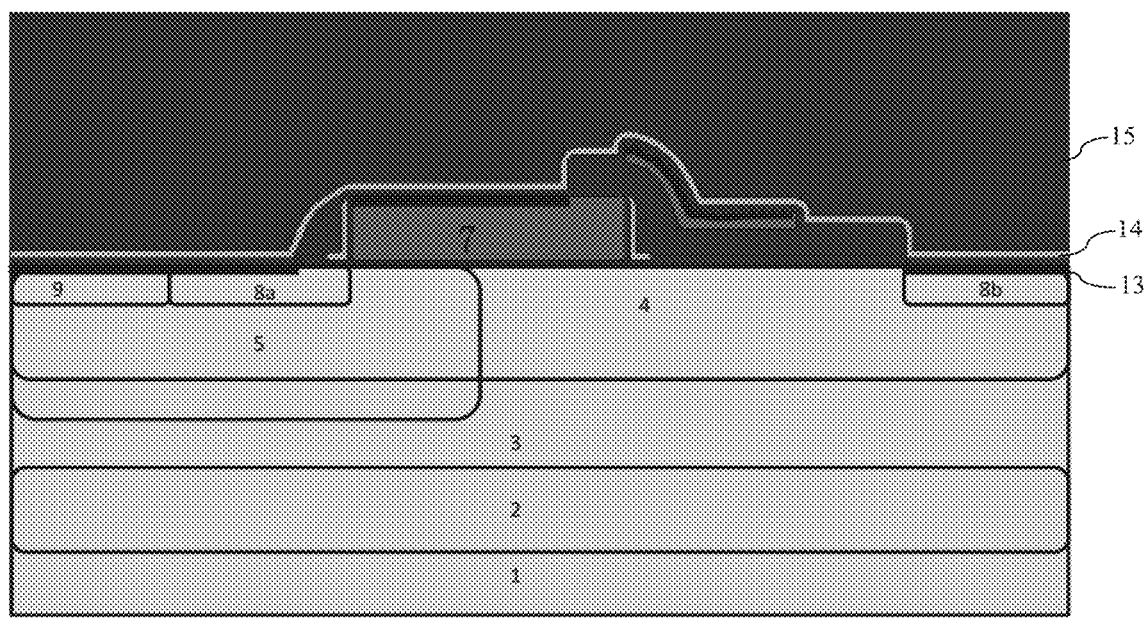

Step 6, as shown in FIG. 3G, the common dielectric layer 11 is photo-etched, wherein after being etched, the common dielectric layer 11 covers a portion, between the second side of the polysilicon gate 7 and the drain region 8b, of the surface of the drift region 4, extends onto the surface of the polysilicon gate 7 and also covers part of the surface of the drain region 8b, and portions, not covered by the common dielectric layer 11, of the surfaces of the polysilicon gate 7, the source region 8a and the drain region 8b are exposed.

Step 7, as shown in FIG. 3G a self-aligned metal silicide 13 is formed on the exposed portions of the surfaces of the polysilicon gate 7, the source region 8a, the drain region 8b and the second polysilicon layer 12 with the common dielectric layer 11 as a growth barrier layer of the self-aligned metal silicide 13, wherein a drain terminal field plate comprises the second polysilicon layer 12 or the self-aligned metal silicide 13 formed through self-aligned metal silicification on the surface of the polysilicon layer 12, and a portion, located at the bottom of the drain terminal field plate, of the common dielectric layer serves as a field plate dielectric layer. The self-aligned metal silicide 13 formed on the surface of the source region 8a also extends onto the surface of the body lead-out region 9.

If the thickness of the second polysilicon layer 12 is decreased to be smaller than 200 Å, the second polysilicon layer 12 is completely converted into the self-aligned metal silicide 13, and in this case, the drain terminal field plate is completely formed by the self-aligned metal silicide 13.

If the second polysilicon layer 12 is not completely converted into the self-aligned metal silicide 13, the drain terminal field plate is formed by stacking the rest of the second polysilicon layer 12 and the self-aligned metal silicide 13 on the surface of the second polysilicon layer 12.

The method further includes the following steps:

Step 8, a contact hole etching stop layer 14 is formed, wherein the contact hole etching stop layer 14 is formed by stacking an oxide layer and a nitride layer.

Step 9, an interlayer 15 is formed, wherein the interlayer film 15 is formed by an oxide layer.

Step 10, contact holes 16 are formed, wherein the corresponding contact holes 16 are formed at the tops of the source region 8a, the drain region 8b, the polysilicon gate 7 and the drain terminal field plate, and the contact holes 16 penetrate through the corresponding interlayer film 15 and the contact hole etching stop layer 14 and make contact with the self-aligned metal silicide 13 at the bottoms of the contact holes 16.

Step 11, a front metal layer 17 is formed, and the front metal layer 17 is patterned through photo-etching to form a source electrode, a gate electrode and a drain electrode.

Wherein the source region 8a is connected to the source electrode via the contact hole 16 at the top of the source region 8a, the drain region 8b is connected to the drain electrode via the contact hole 16 at the top of the drain region, the polysilicon gate 7 is connected to the gate electrode via the contact hole 16 at the top of the polysilicon gate 7, and the drain terminal field plate is also connected to the gate electrode via the contact hole at the top of the drain terminal field plate.

The invention is expounded above with reference to the specific embodiments, but these embodiments are not intended to limit the invention. Various transformations and improvements made by those skilled in this field without deviating from the principle of the invention should also fall within the protection scope of the invention.

What is claimed is:

1. A LDMOS device, comprising:
a first epitaxial layer of a second conduction type, wherein a drift region of a first conduction type and a body region of a second conduction type are formed in selected areas of the first epitaxial layer, and the drift region horizontally makes contact with the body region or is spaced from the body region by a certain distance, the first epitaxial layer is a silicon epitaxial layer;

a gate structure which is formed on a surface of the body region by stacking a gate dielectric layer and a polysilicon gate, wherein channels are formed on the surface, covered by the polysilicon gate, of the body region, and a second side of the gate dielectric layer and a second side of the polysilicon gate extend onto a surface of the drift region;

a source region which is formed on the surface of the body region and has a second side self-aligned with a first side of the polysilicon gate;

a drain region which is formed in a selected area of the drift region and has a first side spaced from the second side of the polysilicon gate by a certain distance; and a common dielectric layer, wherein the common dielectric layer covers a portion, between the second side of the polysilicon gate and the drain region, of the surface of drift region, extends onto a surface of the polysilicon gate and also covers part of a surface of the drain region, a self-aligned metal silicide is formed on portions, not covered by the common dielectric layer, of the surfaces of the polysilicon gate, the source region and the drain region, and the common dielectric layer serves a growth barrier layer of the self-aligned metal silicide; and a drain terminal field plate is formed on a portion, between the second side of the polysilicon gate and the drain region, of a surface of the common dielectric layer, and a portion, located at a bottom of the drain terminal field plate, of the common dielectric layer serves as a field plate dielectric layer;

the drain terminal field plate comprises a second polysilicon layer or a self-aligned metal silicide formed through self-aligned metal silicification on a surface of the second polysilicon layer;

the polysilicon gate is connected to a gate electrode formed by a front metal layer via the contact hole at the top of the polysilicon gate, and the drain terminal field plate is also connected to the gate electrode formed by the front metal layer via the contact hole at the top of the drain terminal field plate.

2. The LDMOS device according to claim 1, wherein a first doped buried layer of the first conduction type is formed at a bottom of the first epitaxial layer and is located on a surface of a semiconductor substrate.

3. The LDMOS device according to claim 2, wherein the semiconductor substrate is a silicon substrate;
the gate dielectric layer is made from silicon oxide; and
the common dielectric layer is made from silicon oxide.

4. The LDMOS device according to claim 1, wherein a heavily-doped body lead-out region of the second conduction type is formed on the surface of the body region and makes contact a side face of a first side of the source region, and the self-aligned metal silicide on the surface of the source region extends onto the surface of the body lead-out region.

5. The LDMOS device according to claim 1, wherein the LDMOS device further comprises:
a contact hole etching stop layer, an interlayer film, contact holes and a front metal layer, wherein:
the contact holes penetrate through the corresponding interlayer film and the contact hole etching stop layer and make contact with the self-aligned metal silicide at bottoms of the contact holes; and
the corresponding contact holes are formed at tops of the source region, the drain region, the polysilicon gate and the drain terminal field plate, the source region is connected to a source electrode formed by the front metal layer via the contact hole at the top of the source region, the drain region is connected to a drain electrode formed by the front metal layer via the contact hole at the top of the drain region.

6. The LDMOS device according to claim 5, wherein the contact hole etching stop layer is formed by stacking an oxide layer and a nitride layer; and the interlayer film is formed by an oxide layer.

7. The LDMOS device according to claim 1, wherein a spacer is formed on a side face of the polysilicon gate.

8. The LDMOS device according to claim 1, if a thickness of the second polysilicon layer is decreased to be smaller than 200 Å, the second polysilicon layer is completely converted into the self-aligned metal silicide, and in this case, the drain terminal field plate is completely formed by the self-aligned metal silicide; and if the second polysilicon layer is not completely converted into the self-aligned metal silicide, the drain terminal field plate is formed by stacking the rest of the second polysilicon layer and the self-aligned metal silicide on the surface of the second polysilicon layer.

\* \* \* \* \*